(12) United States Patent
Fischer et al.

(10) Patent No.: US 7,151,436 B2
(45) Date of Patent: Dec. 19, 2006

(54) RECEIVING/BACKSCATTERING ARRANGEMENT AND METHOD WITH TWO MODULATION MODES FOR WIRELESS DATA TRANSMISSION AS WELL AS MODULATION ARRANGEMENT THEREFOR

(75) Inventors: Martin Fischer, Gleichen (DE); Ulrich Friedrich, Ellhofen (DE)

(73) Assignee: ATMEL Germany GmbH, Heilbronn (DE)

( * ) Notice: Subject to any disclaimer, the term of this patent is extended or adjusted under 35 U.S.C. 154(b) by 229 days.

(21) Appl. No.: 10/753,859

(22) Filed: Jan. 7, 2004

(65) Prior Publication Data

US 2004/0145452 A1    Jul. 29, 2004

(30) Foreign Application Priority Data

Jan. 10, 2003  (DE)  ................................ 103 01 451

(51) Int. Cl.
*H04Q 5/22*    (2006.01)

(52) U.S. Cl. .................. 340/10.1; 340/10.2; 340/3.51; 340/10.4; 340/505; 340/572.2; 340/572.4; 340/572.5; 340/825.69; 340/825.72; 340/10.51; 340/10.5; 340/10.3

(58) Field of Classification Search ............... 340/10.1, 340/10.2, 3.51, 505, 572.2, 572.4, 572.5, 340/825.69, 825.72; 329/304; 332/103, 332/149, 151; 374/324, 316; 375/324, 316
See application file for complete search history.

(56) References Cited

U.S. PATENT DOCUMENTS

| | | | |
|---|---|---|---|
| 4,040,053 A | 8/1977 | Olsson | |
| 5,119,099 A | 6/1992 | Haruyama et al. | |
| 5,153,583 A | 10/1992 | Murdoch | |
| 5,206,639 A | 4/1993 | Kamens | |
| 5,218,343 A | 6/1993 | Stobbe et al. | |
| 5,564,069 A | 10/1996 | Grabow et al. | |
| 5,606,323 A * | 2/1997 | Heinrich et al. | 340/10.34 |
| 5,731,691 A | 3/1998 | Noto | |
| 5,889,489 A | 3/1999 | Friedman et al. | |
| 6,054,925 A | 4/2000 | Proctor et al. | |
| 6,347,121 B1 * | 2/2002 | Sointula | 375/259 |
| 6,366,164 B1 | 4/2002 | Hanselmann | |
| 6,650,226 B1 | 11/2003 | Wuidart et al. | |
| 6,664,770 B1 | 12/2003 | Bartels | |
| 6,703,921 B1 | 3/2004 | Wuidart et al. | |
| 6,731,198 B1 | 5/2004 | Stobbe et al. | |
| 6,941,113 B1 * | 9/2005 | Asano | 455/73 |

(Continued)

FOREIGN PATENT DOCUMENTS

DE    40 17 625    12/1990

(Continued)

*Primary Examiner*—Brian Zimmerman
*Assistant Examiner*—Vernal Brown
(74) *Attorney, Agent, or Firm*—W. F. Fasse; W. G. Fasse

(57) ABSTRACT

For transmitting data, a receiving/backscattering arrangement receives, modulates and reflects or backscatters electromagnetic waves emitted by a base station. The modulation corresponds to the data to be transmitted and is carried out selectively using first and/or second different modulation methods depending on the received field strength of the received electromagnetic waves. Preferably, phase shift keying is used especially or at least at low field strengths at far range, while amplitude shift keying is used additionally or alternatively for high field strengths at close range. The two modulation methods can be superimposed. A circuit arrangement includes two different modulator arrangements to perform the two modulation methods depending on the received field strength. The second modulator arrangement preferably comprises a multi-stage voltage multiplier circuit with a modulated switching device intervening in one of the stages to achieve the modulation.

13 Claims, 3 Drawing Sheets

U.S. PATENT DOCUMENTS

| | | | |
|---|---|---|---|
| 2002/0080864 A1* | 6/2002 | Kuttruff et al. | 375/211 |
| 2002/0153996 A1* | 10/2002 | Chan et al. | 340/10.4 |
| 2003/0102961 A1 | 6/2003 | Fischer et al. | |
| 2003/0107483 A1* | 6/2003 | Kano | 340/540 |
| 2003/0205571 A1* | 11/2003 | Flugstad et al. | 219/497 |
| 2004/0155754 A1 | 8/2004 | Fischer et al. | |
| 2004/0257220 A1 | 12/2004 | Fischer et al. | |
| 2004/0257293 A1 | 12/2004 | Friedrich et al. | |

FOREIGN PATENT DOCUMENTS

| | | |
|---|---|---|
| DE | 42 13 879 | 11/1993 |
| DE | 43 32 475 | 3/1995 |
| DE | 196 29 291 | 1/1997 |
| DE | 196 14 455 | 10/1997 |
| DE | 196 53 841 | 6/1998 |
| DE | 198 00 565 | 7/1999 |
| DE | 199 33 978 | 1/2001 |
| DE | 199 58 265 | 6/2001 |
| DE | 101 58 442 | 6/2003 |
| EP | 0441237 | 8/1991 |
| EP | 0 599 143 | 6/1994 |
| EP | 0 892 940 | 3/1998 |
| EP | 1 018 692 | 7/2000 |
| EP | 1 026 832 | 8/2000 |
| EP | 1 045 336 | 10/2000 |
| EP | 1 083 519 | 3/2001 |
| EP | 1 120 734 | 8/2001 |
| EP | 1211635 | 6/2002 |
| EP | 1 326 202 | 7/2003 |
| FR | 2 644 308 | 9/1990 |
| FR | 2 782 209 | 2/2000 |
| GB | 2224182 | 4/1990 |
| GB | 2 321 726 | 8/1998 |
| WO | WO 00/45330 | 8/2000 |

* cited by examiner

RECEIVING/BACKSCATTERING ARRANGEMENT AND METHOD WITH TWO MODULATION MODES FOR WIRELESS DATA TRANSMISSION AS WELL AS MODULATION ARRANGEMENT THEREFOR

CROSS-REFERENCE TO RELATED APPLICATIONS

This application is related to U.S. application Ser. No. 10/753,849 filed Jan. 7, 2004, U.S. application Ser. No. 10/855,865 filed May 26, 2004, and U.S. application Ser. No. 10/855,866 filed May 26, 2004.

PRIORITY CLAIM

This application is based on and claims the priority under 35 U.S.C. §119 of German Patent Application 103 01 451.9, filed on Jan. 10, 2003, the entire disclosure of which is incorporated herein by reference.

FIELD OF THE INVENTION

The invention relates to a method for wireless or contactless data transmission between a base station and a receiving/backscattering arrangement. The invention further relates to a receiving/backscattering arrangement suitable for carrying out this method, as well as to a modulation arrangement that can be used in this regard.

BACKGROUND INFORMATION

There are various known systems in which a wireless or contactless data transmission is carried out between one or more base stations or reader devices and one or more electronic data carriers or so-called transponders. Such systems are used, for example, as contactless identification systems or so-called RFID (radio frequency identification) Systems. In that case, the data to be transmitted relates to an identification protocol, for example. It is further possible to integrate one or more sensors, for example temperature measuring sensors, on the transponder. Such transponders equipped with integrated sensors are then also referred to as remote sensors, whereby the data to be transmitted may comprise the actual values measured by the sensor.

The transponders, or particularly the receiving/backscattering arrangements thereof, typically do not comprise an active transmitter for actively carrying out the data transmission to the base station. Instead, the transponders are non-active systems that can be designated as passive systems if they do not comprise their own power supply, or as semi-passive systems if they do comprise their own power supply. In such non-active systems, the data transmission over a transmission range or distance of substantially more than one meter is generally carried out using a so-called backscattering or backscatter-coupling of UHF waves or microwaves between the receiving/backscattering arrangement (i.e. transponder) and the base station. While such non-active transponders are sometimes also called receiver/transmitters or receiving/transmitting arrangements, this application uses the more accurate term "receiving/backscattering arrangement", because this arrangement does not actively transmit but rather merely reflects or backscatters the modulated received electromagnetic wave.

In this regard, the base station emits electromagnetic waves, which are received by the transponder, and then modulated by the transponder in accordance with the particular data that are to be transmitted back to the base station. The thusly modulated signal or electromagnetic waves are then reflected or backscattered with the modulation back to the base station. This is generally achieved using an input impedance variation of the receiving/backscattering arrangement, which causes a corresponding variation of the reflection characteristics of an antenna connected thereto. Thereby the reflected or backscattered signal is correspondingly modulated, so that the base station can receive and evaluate the modulated backscattered signal. Various different methods are known for achieving such modulation.

A first known method of carrying out the above described modulation, for example as described in the published European Patent Application EP 1 211 635, the real part of the input impedance is varied by connecting or disconnecting an essentially ohmic (i.e. resistive) load, which causes mainly an amplitude variation or amplitude modulation of the reflected waves. This modulation method is generally referred to as amplitude shift keying (ASK). Disadvantageously, the variable ohmic or resistive load used for the modulation acts as an additional power consumer that loads the voltage supply of the transponder, whereby the maximum operating transmission range between the transponder and the base station is considerably reduced, especially for a passive transponder without its own power supply.

In a second known method of achieving the above discussed modulation, the imaginary part of the input impedance is varied or influenced by varying the capacitance of a capacitor in the input portion or stage of the receiving/transmitting or backscattering arrangement. This causes mainly a phase variation or a phase modulation of the reflected waves, and is generally referred to as phase shift keying (PSK). Such a method is disclosed, for example, in the earlier German Patent Application DE 101 58 442.3 (published Jun. 26, 2003) of the same assignee as the present application. Also see the counterpart US published application US 2003/0102961 A1 (published Jun. 5, 2003), the disclosure of which is incorporated herein by reference. In comparison to the ASK method, this PSK modulation method practically does not influence the operating voltage, whereby a high operating efficiency of the transponder can be achieved, and the maximum backscattering range between the transponder and the base station is increased. However, the power reflected by the transponder decreases as the spacing distance between the transponder and the base station becomes smaller. At very small ranges or distances between the transponder and the base station, it can even occur that the base station can no longer detect the phase-modulated signal reflected from the transponder.

SUMMARY OF THE INVENTION

In view of the above, it is an object of the invention to provide a method, an associated receiving/backscattering arrangement, as well as a modulation arrangement usable therefor, which can achieve a reliable data transmission, for example between a base station and a passive or semi-passive transponder, over a wide range of backscattering distances, spanning from relatively small to relatively large backscattering distances, in comparison to the prior art. It is a further object of the invention to make optimal use of two different modulation modes or processes, while taking advantage of the benefits yet avoiding the disadvantages of each one of these modulation modes or processes. The invention further aims to avoid or overcome the disadvantages of the prior art, and to achieve additional advantages, as apparent from the present specification. The attainment of these objects, however, is not a required limitation of the invention.

The above objects have been achieved according to the invention in a method for wireless or contactless data transmission between a base station and a receiving/backscattering arrangement, for example preferably a transponder, in which the base station emits electromagnetic waves, which are received by the receiving/backscattering arrangement, modulated in this arrangement dependent on the data that are to be transmitted to the base station, and the resulting modulated signal is reflected or backscattered from the receiving/backscattering arrangement back to the base station. The above objects have further been achieved according to the invention in a receiving/backscattering arrangement, such as preferably a transponder, which is suitable for carrying out the inventive method. The above objects have still further been achieved according to the invention in a modulation arrangement suitable for use as a component or portion in the receiving/backscattering arrangement according to the invention. The method and the arrangements according to the invention comprise special features that will be described next.

The method according to the invention provides different first and second modulation methods by which the received electromagnetic waves may be modulated and reflected back to the base station. More particularly, depending on the field strength of the electromagnetic waves received by the receiving/backscattering arrangement, the inventive method will use a second modulation method additionally or alternatively to the first modulation method, for modulating and reflecting the received waves back to the base station. This selective or combined use of two different modulation methods achieves a particularly reliable and secure operation of the receiving/backscattering arrangement over a broad distance range, because the two distinct modulation methods can be combined or selected individually so that an optimal or at least sufficient modulation power is provided for every backscattering distance or range, or for every particular data transmission situation.

In a further particular embodiment of the method according to the invention, the second modulation method is selected or activated and used for the modulation when the received field strength exceeds an adjustable field strength threshold value. Such an activation of the second modulation method only for higher received field strengths increases the achievable backscattering range between the base station and the receiving/backscattering arrangement, because only a single (i.e. the first) modulation method is active for large backscattering ranges or distances which thus necessarily have low field strengths whereby this first modulation method is specifically designed for optimum performance in this distance range, and simultaneously improves the operational security or reliability in the close range with high field strengths, i.e. when the threshold field strength is exceeded, because in this range there is sufficient radiated power available and being received so that the further second modulation method may be operated.

According to a further preferred feature of the inventive method, a reference voltage and/or a reference current is used for detecting when the received field strength exceeds the threshold field strength. Thereby, the activation of the additional or alternative modulation method can be carried out quite simply, for example using a comparator.

Further preferably according to the invention, the first modulation method comprises a phase shift keying and/or the second modulation method comprises an amplitude shift keying. On the one hand, the phase shift keying is able to achieve large transmission or backscattering distances between the base station and the receiving/backscattering arrangement, and this method is easy to carry out in a rather simple circuit arrangement. On the other hand, the amplitude shift keying provides a robust transmission or backscattering method especially in the close range.

Further according to the invention, the degree of modulation, i.e. the modulation factor, of the second modulation method may be regulated dependent on the received field strength. This makes it possible to achieve an optimum adjustment of the modulation power and thus avoids unnecessary power consumption.

In a further embodiment of the method according to the invention, the amplitude shift keying involves varying the set point value or desired value of a regulator, which can be any desired type of regulator, for example a voltage regulator or a current regulator. Throughout this specification, the terms "set point value" and "desired value" will be used interchangeably to mean a specified value, a nominal value, a desired value, or a set value that is to be achieved.

In a further development of the inventive method, the amplitude shift keying involves varying the operating or working point of a limiter circuit, and/or intervening or connecting into a voltage multiplier circuit. Both of these measures can be carried out quite simply and are also simple to realize in a concrete circuit arrangement. In the embodiment involving intervention or connection into the voltage multiplier circuit, a high operating efficiency can be achieved, because a smoothing capacitor or load capacitor, which is typically arranged after or downstream of the rectifier, is not loaded by the modulation arrangement.

The receiving/backscattering arrangement according to the invention is suitable for carrying out the above described inventive method. For this purpose, the arrangement includes a first modulator arrangement and a second modulator arrangement, which can be selectively activated to modulate the received electromagnetic waves dependent on the particular data to be transmitted to the base station. Particularly according to the invention, the second modulator arrangement is adapted to be activated in addition to or as an alternative to the first modulator arrangement, dependent on the received field strength of the received electromagnetic waves.

In a particular embodiment of the inventive arrangement, the second modulator arrangement is coupled to the output side of a rectifier. This serves to prevent the parasitic characteristics of the electronic components of the second modulator arrangement from having an influence in the high frequency region on the input side, that is to say on the antenna input.

In a further embodiment of the receiving/backscattering arrangement according to the invention, the second modulator arrangement comprises a regulator, and especially a voltage regulator, as well as reference elements, especially zener diodes having various different zener voltages, whereby these reference elements serve to provide the set point value adjustment of the regulator. Among other things, using the regulator allows the effects of the amplitude shift keying to be regulated.

In a further embodiment of the receiving/backscattering arrangement according to the invention, the second modulator arrangement comprises a limiter circuit with plural diodes, which are connected in series in the forward conducting or feed direction between a supply voltage and a reference potential, as well as a controllable switching device, which is connected between a junction point between two diodes on the one hand, and the reference potential on the other hand. This switching device has a control input that is connected to a control line so as to receive a modulation control signal representing the data to be transmitted. Such a circuit arrangement can be easily and economically produced, and can also easily be combined with the first modulator arrangement. The activation of the amplitude shift keying first takes place upon exceeding a limit voltage of the limiting circuit, and is carried out in synchronism with the modulation control signal by variation of the operating point of the limiter circuit with the aid of the switching device.

According to a further embodiment of the receiving/backscattering arrangement of the invention, the second modulator arrangement comprises a series circuit of diodes, which are connected in the forward conducting or feed direction between a supply voltage and a reference potential, a controllable switching device, which is connected between the supply voltage and the reference potential, and a logic gate. The suitably circuit-connected logic gate serves to carry out the field strength dependent releasing or enabling of the switching device. In this manner it can be s ensured, that no amplitude shift keying will take place when the received field strength is below an adjustable field strength threshold value, that is to say for a low radiated power, e.g. a great transmission distance or range.

In a further development of the receiving/backscattering arrangement, the switching device is connected between a circuit node of a stage of a voltage multiplier circuit and the reference potential. In this case also, the amplitude shift keying only takes place after an adjustable threshold field strength is exceeded, by means of intervention or coupling into the voltage multiplier circuit.

The receiving/backscattering arrangement according to the invention may particularly be embodied as a passive transponder or as a semi-passive transponder. In this regard, the inventive combination of at least two separately activatable modulator arrangements is especially advantageous for passive transponders, because a high modulation power is ensured with an adequate radiated power in the close range field of the base station, while exclusively an energy-saving modulation method is used in the far range field with a low radiated power. Thus, according to the invention, the back-scattering can be carried out in an efficient and optimal manner both at close range and at long or far range, without requiring the transponder to have its own power supply, namely the transponder can extract its power requirements from the received electromagnetic waves.

In the modulator arrangement according to the invention for carrying out the amplitude shift keying, a rectifier comprises a multi-stage voltage multiplier circuit, and a circuit node of a stage of the voltage multiplier circuit is connected with a controllable switching device, which selectively connects or disconnects the node relative to a reference potential dependent on a control signal applied to the switching device. This makes it possible to achieve an efficient amplitude shift keying, in which the parasitic characteristics of the electronic components of the modulator arrangement do not have an influence in the high frequency region on the input side. Simultaneously, a capacitor that might be used for smoothing the output voltage of the voltage multiplier circuit is loaded only insubstantially or inconsiderably by the switching processes carried out in connection with the modulation.

BRIEF DESCRIPTION OF THE DRAWINGS

In order that the invention may be clearly understood, it will now be described in connection with advantageous example embodiments thereof, with reference to the accompanying drawings, wherein.

DETAILED DESCRIPTION OF PREFERRED EXAMPLE EMBODIMENTS AND THE BEST MODE OF THE INVENTION

Figure 1:
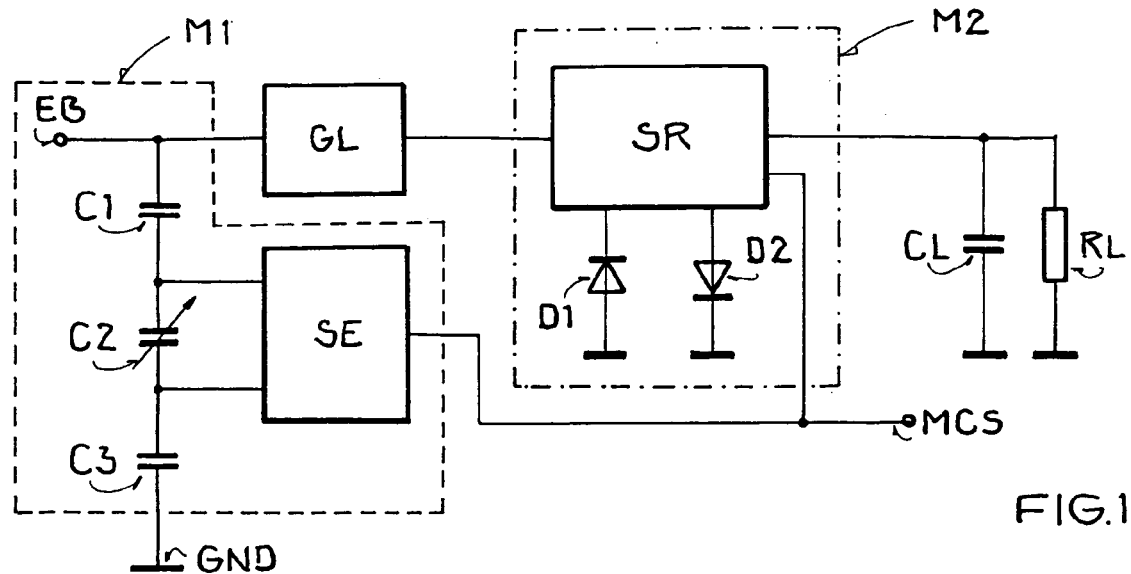
FIG. 1 is a schematic circuit diagram of a first embodiment of a receiving/backscattering arrangement according to the invention, in which an amplitude shift keying is carried out using a voltage regulator.

FIG. 1 shows a receiving/backscattering arrangement of a passive or semi-passive transponder according to the invention, for carrying out the bi-directional wireless or contactless communication with a base station (not shown), which may comprise any conventionally known or desired component or components adapted to communicate with the transponder.

In this arrangement according to the invention, a first modulator arrangement M1 serves to carry out a first modulation method in the form of a phase shift keying. For this purpose, the first modulator arrangement M1 comprises a first capacitor C1, a voltage-controllable second capacitor C2 in the form of a MOS-varactor, a third capacitor C3, and a control unit SE for controlling the controllable capacitor C2.

The inventive arrangement further includes a second modulator arrangement M2 for carrying out a second modulation method in the form of an amplitude shift keying. For this purpose, the second modulator arrangement M2 comprises a voltage regulator SR with two reference elements in the form of two zener diodes D1 and D2 with respective different zener voltages. Furthermore, a rectifier GL, which may internally comprise plural stages, is provided. A capacitive load CL and an ohmic or resistive load RL represent the respective load components of subsequently or downstream connected circuit components of the transponder, which are not illustrated and are not of further interest here. This capacitive load CL serves for smoothing the output voltage of the rectifier GL.

An antenna (not shown) is connected to an input socket or contact EB and to a reference potential such as ground GND. An externally generated and applied modulation control signal MCS represents the data to be transmitted in the form of a bit sequence, for example, and serves for activating and controlling the control unit SE in the first modulator arrangement M1 and the voltage regulator SR in the second modulator arrangement M2.

The base station (not shown) emits electromagnetic waves, for example in the ultra-high frequency (UHF) range, which are received by the antenna (not shown) of the transponder. A portion of the power of the received electromagnetic waves serves to supply the electrical power required by the circuitry of the transponder. This extraction of the respective portion of the received power can be carried out in any conventionally known manner, and is not of significance to the present invention. Another portion, e.g. the remainder, of the received power of the received electromagnetic waves is modulated and reflected or backscattered by the transponder, e.g. back toward the base station.

The modulation is carried out dependent on the particular data that are to be transmitted to the base station. The preparation or provision of these data can be carried out according to any conventionally known methods and circuit arrangements, and is not significant to the present invention. Instead, the data is externally applied to the inventive arrangement in the modulation control signal MCS, which is applied to control the operation of the control unit SE and the voltage regulator SR as will be described below.

The alternating voltage signal received by the antenna and prevailing at the input stage or portion between the input socket EB and the reference potential GND is applied across the capacitors C1, C2 and C3, and is also applied to the rectifier GL. The arising rectified signal is provided to the voltage regulator SR. The capacitive load CL and the ohmic or resistive load RL representing the rest of the transponder circuitry are connected to an output of the voltage regulator SR.

The capacitors C1, C2 and C3 of the first modulator arrangement M1 are connected in series between the input socket EB and the reference potential GND. The two terminals of the voltage controllable capacitor C2 are further respectively individually connected to two outputs of the control unit SE. The control unit SE receives the modulation control signal MCS and accordingly outputs a control voltage dependent on the control signal MCS to the capacitor C2. Thereby, the capacitance of the capacitor C2 is adjusted corresponding to the control voltage. Thus, a variation of the control signal MCS causes a variation of the input impedance of the receiving/backscattering arrangement between the input socket EB and the reference potential GND. In this regard, essentially only the imaginary part of the input impedance is influenced. This impedance variation or change leads to a variation or change of the reflection characteristics of the antenna, and thus to a phase variation or a phase modulation of the electromagnetic waves reflected from the antenna. The time course or progression of the control signal MCS represents a sequence of data or bits that are to be transmitted. Thus, this sequence of data or bits is ultimately represented in the phase modulation of the signal reflected from the antenna as described above. Furthermore, the capacitors C1 and C3 achieve a DC decoupling of the control voltage applied to the capacitor C2 with respect to the reflection characteristics of the antenna, because the frequency of the control signal MCS is small relative to the frequency of the electromagnetic wave that is received, modulated and backscattered as a carrier wave for the transmitted data.

The first modulator arrangement M1 is and remains active independent of the received field strength of the received electromagnetic wave, as long as at least a sufficient power for operating the transponder is being received and is available. The second modulator arrangement M2 only begins to contribute to or participate in the modulation after the received field strength exceeds a threshold field strength that has been determined by the zener voltages of the zener diodes D1 and D2. Advantageously, the zener voltages are selected or dimensioned in such a manner, so that a reduction of the modulation power of the phase shift keying for a high received field strength in the close range of the base station will at least be compensated by the added modulation power of the second modulator arrangement carrying out an amplitude shift keying. An increase of the dissipated power in an ohmic or resistive load that is necessarily caused thereby is not critical in the close range, because sufficient radiated power is nonetheless available for supplying the power needs of the transponder.

In the voltage regulator SR, the modulation control signal MCS serves to switch between the two zener diodes D1 and D2 as the respective active component for specifying or determining the set point value or desired value of the voltage. In other words, the respective voltage drop across the zener diode D1 or the zener diode D2 serves as the set point or desired value of the voltage for the voltage regulator SR. When the output voltage of the rectifier GL is greater than both zener voltages of the zener diodes D1 and D2, these zener diodes will respectively be conducting upon activation, whereby the set point value or desired value and therewith the output voltage of the voltage regulator SR will alternate between the two corresponding zener voltages. Due to this output voltage variation and the connected loads RL and CL, essentially the real part of the input impedance will correspondingly be varied, whereby an amplitude shift keying of the reflected wave is achieved. In this situation, both modulation methods are simultaneously active and are superposed on each other. In other words, the reflected wave exhibits both an amplitude shift keying and a phase shift keying in accordance with the data to be transmitted, i.e. the data represented by the modulation control signal MCS.

In contrast, below a threshold field strength and a threshold voltage arising therefrom at the output of the rectifier GL, neither of the two zener diodes D1 and D2 are conductive. In this situation, the voltage prevailing on both of the zener diodes D1 and D2 upon their activation is approximately equal to the voltage prevailing at the output of the rectifier GL. As a result, independent of the modulation control signal MCS, the set point value or desired value and thus the output voltage of the voltage regulator SR is approximately equal to the output voltage of the rectifier GL. In this condition of a "low" received field strength, therefore, an amplitude shift keying does not take place.

In an intermediate voltage range (corresponding to an intermediate received field strength range), in which the output voltage of the rectifier GL is greater than the smaller zener voltage among the two zener diodes but smaller than the greater zener voltage among the two zener diodes, the set point value and therewith the output voltage of the voltage regulator SR will alternate between the lower zener voltage and the output voltage of the rectifier GL. This effects an amplitude shift keying with a reduced modulation factor or degree of modulation in comparison to the above described situation in which the rectifier output voltage exceeds both zener voltages.

Figure 2:
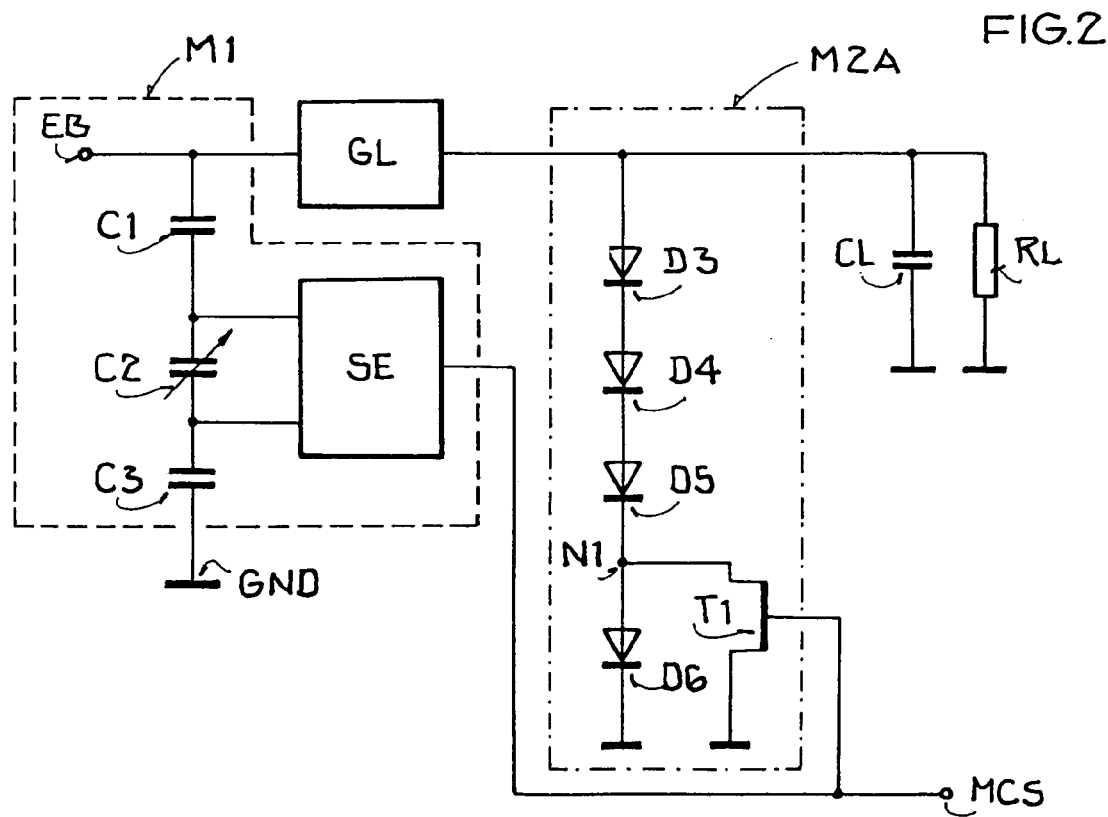
FIG. 2 is a schematic circuit diagram of a second embodiment of a receiving/backscattering arrangement according to the invention, in which an amplitude shift keying is carried out using a limiter circuit of which the operating point is adjusted.

FIG. 2 shows a second embodiment of a receiving/backscattering arrangement according to the invention, in which the amplitude shift keying is achieved using a limiter circuit, of which the working or operating point is adjusted, i.e. varied. The circuit arrangement shown here differs from that according to FIG. 1 only with respect to the embodiment of the second modulator arrangement M2 for carrying out the amplitude shift keying, which is here designated as M2A. The remainder of the inventive arrangement corresponds to that described above in connection with FIG. 1, and will not be redundantly described here.

The second modulator arrangement M2A comprises diodes D3 to D6 which are connected in a series circuit in the forward conducting or feed direction between a supply voltage, i.e. the output of the rectifier GL, and a reference potential such as ground GND. The second modulator arrangement M2A further comprises a MOS transistor T1 as a switching device, having one terminal of its drain-source path connected with a junction point N1 between the diode D5 and the diode D6, and having the other terminal of its drain-source path connected to ground GND. In other words, the transistor T1 is connected with its switchable conduction path in parallel to the last diode D6. A control input of the transistor T1 is connected to a control line which applies the modulation control signal MCS thereto.

Also in this embodiment, the second modulator arrangement M2A only contributes to or participates in the modulation after the output voltage of the rectifier GL exceeds a threshold voltage.

If this output voltage lies below the sum of the forward conduction voltages of the diodes D3 to D6, the diode circuit or path is not conductive, so that the application of the modulation control signal MCS to the transistor T1 has no influence, i.e. is irrelevant. If, however, the output voltage of the rectifier GL is greater than the sum of the forward conducting voltages of the diodes, then the modulation control signal MCS will correspondingly switch on and switch off the transistor T1 according to the bit sequence represented by the control signal MCS, whereby the switched-on or conducting transistor T1 will shunt or bridge over the last diode D6, which causes the output voltage to be reduced by approximately the amount of the forward conducting voltage of the diode D6. On the other hand, when the transistor T1 is switched-off or non-conducting, then the forward conducting voltage of the last diode D6 will be added to the sum of the diode voltages, whereby the output voltage is correspondingly increased. Thus, an alternating modulation control signal MCS causes a corresponding alternating voltage, which alternates by the amount of the forward conduction voltage of the diode D6, at the output side of the rectifier GL. As already discussed above in connection with FIG. 1, this leads to a corresponding variation of the real part of the input impedance, whereby an amplitude shift keying of the reflected signal is achieved. In this operating condition or range, both modulation methods are active and are superimposed on one another in the modulated reflected signal as discussed above.

Figure 3:
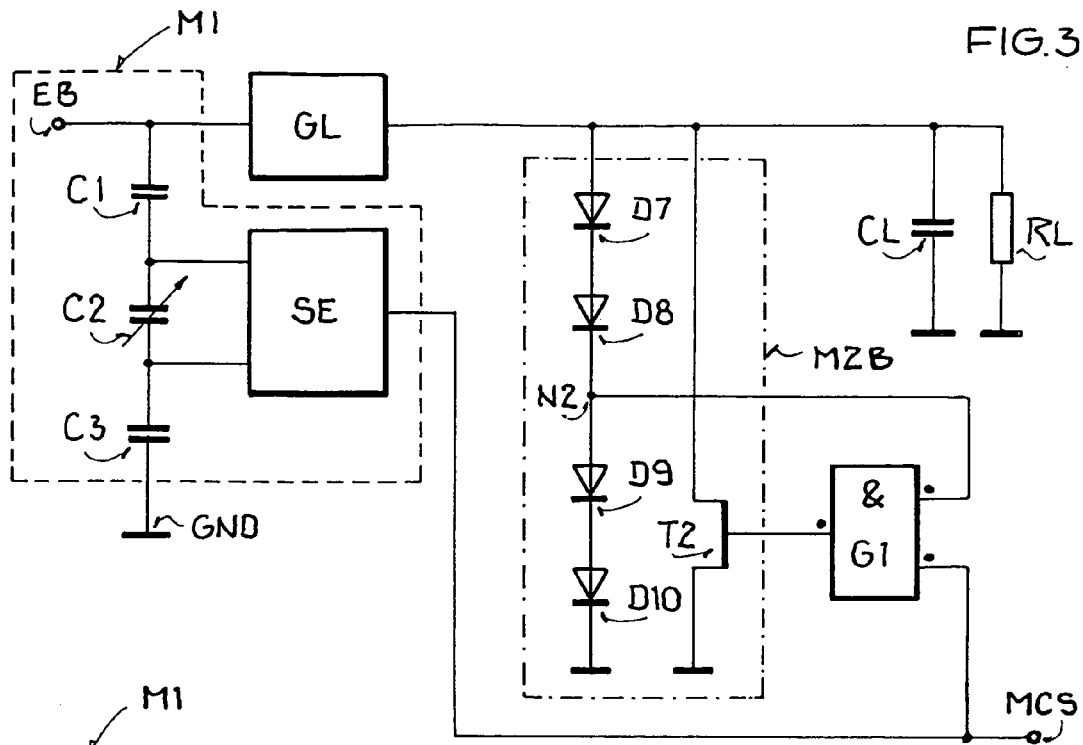
FIG. 3 is a schematic circuit diagram of a third embodiment of a receiving/backscattering arrangement according to the invention, in which a diode path or circuit is used for generating a reference voltage, which serves for releasing or enabling the amplitude shift keying.

FIG. 3 shows a third embodiment of a receiving/backscattering arrangement according to the invention, in which a series diode circuit or path is used for generating a reference voltage, which serves to release or enable the amplitude shift keying. This embodiment of the arrangement differs from the embodiments described above once again only with respect to the second modulator arrangement M2 for carrying out the amplitude shift keying, which is here designated as M2B. The similar portions of the arrangement in comparison to the above embodiments will not be discussed redundantly here.

The second modulator arrangement M2B comprises diodes D7 to D10, which are connected in series between the rectifier output voltage and ground, generally similarly as the diodes D3 to D6 in FIG. 2. The second modulator arrangement M2B further comprises a MOS transistor T2, having one terminal of its drain-source path connected to the supply voltage, i.e. the output voltage of the rectifier GL, and having the other terminal of its drain-source path connected to ground GND. The arrangement M2B further comprises an AND gate G1, having a first input connected to receive the modulation control signal MCS and a second input connected to a junction point N2 between the diode D8 and the diode D9. The output of the AND gate G1 is connected to a control input of the transistor T2.

The reference voltage prevailing at the node or junction point N2 serves as the release or enabling signal for the amplitude shift keying. When the output voltage of the rectifier GL is not sufficient to make the series diode circuit conductive, a logic "0" prevails at the input of the AND gate G1 connected to the junction node N2. Thus, the output of the gate G1 provides a "0", such that the transistor T2 is switched off or blocked. In this situation, the second modulator arrangement M2B will remain inactive despite the application of an alternating modulation control signal MCS. A release, that is to say an activation, of the second modulator arrangement M2B takes place only after the output of the rectifier GL reaches or exceeds a sufficient voltage level to make the series diode path conductive, which is achieved only after receiving a sufficiently high field strength of the received electromagnetic waves.

When a sufficient voltage level for activation is available at the output of the rectifier GL, then the diode series circuit of the diodes D7 to D10 will be made conductive, and a logical "1" or high signal will be applied from the junction node N2 to the corresponding connected input of the AND gate G1. Thus, in this condition, the output signal of the gate G1 will correspond to the modulation control signal MCS applied to the other input of the gate G1, so that the transistor T2 will be switched on and off synchronously with the modulation control signal MCS, which will cause a corresponding load modulation at the output of the rectifier GL. Namely, when the transistor T2 is switched on, the transistor will shunt or bypass the series circuit of the diodes D7 to D10, and thereby draw down the voltage at the output of the rectifier GL, but when the transistor T2 is switched off, the prevailing voltage will be determined by the sum of the forward conduction voltages of the series-connected diodes. This load modulation results in an amplitude shift keying of the signal being reflected or backscattered from the antenna, in the manner discussed above.

Figure 4:
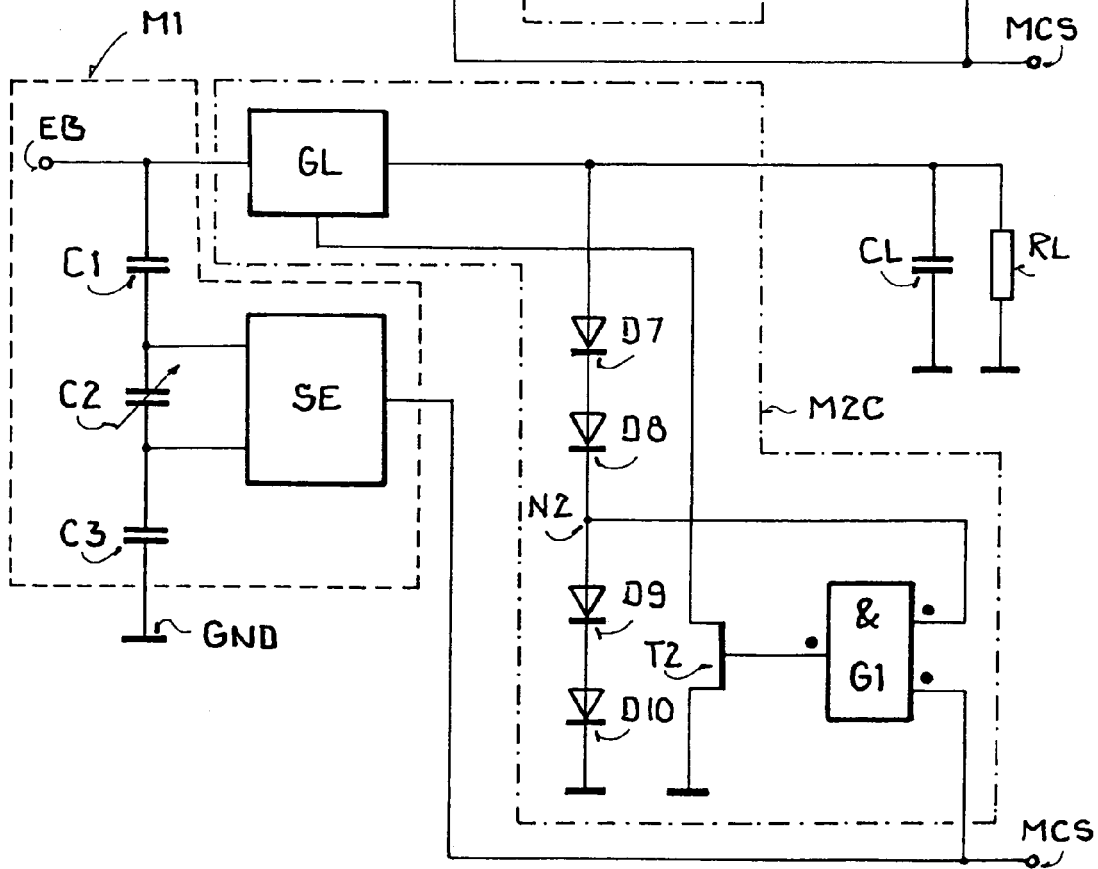
FIG. 4 is a schematic circuit diagram of a fourth embodiment of a receiving/backscattering arrangement according to the invention, in which an amplitude shift keying is carried out by intervening or coupling into a multi-stage voltage multiplier circuit of a rectifier.

A variation of the embodiment of the circuit arrangement of FIG. 3 is shown in FIG. 4, in which the amplitude shift keying is carried out or achieved by a characteristically designed inventive modulation circuit. In this particular circuit design, the rectifier GL comprises a multi-stage voltage multiplier circuit, into which a connection or intervention can be carried out by a suitable switching device. Here, the modulator arrangement for the amplitude shift keying is designated as M2C. In comparison to the arrangement of FIG. 3, here in FIG. 4 the drain-source path of the transistor T2, functioning as the switching device, is connected between ground GND and an internal stage of the voltage multiplier circuit within the rectifier GL. The operation of the arrangement according to FIG. 4 generally corresponds to that described in connection with FIG. 3, with further details that will be described next in connection with FIG. 5.

Figure 5:
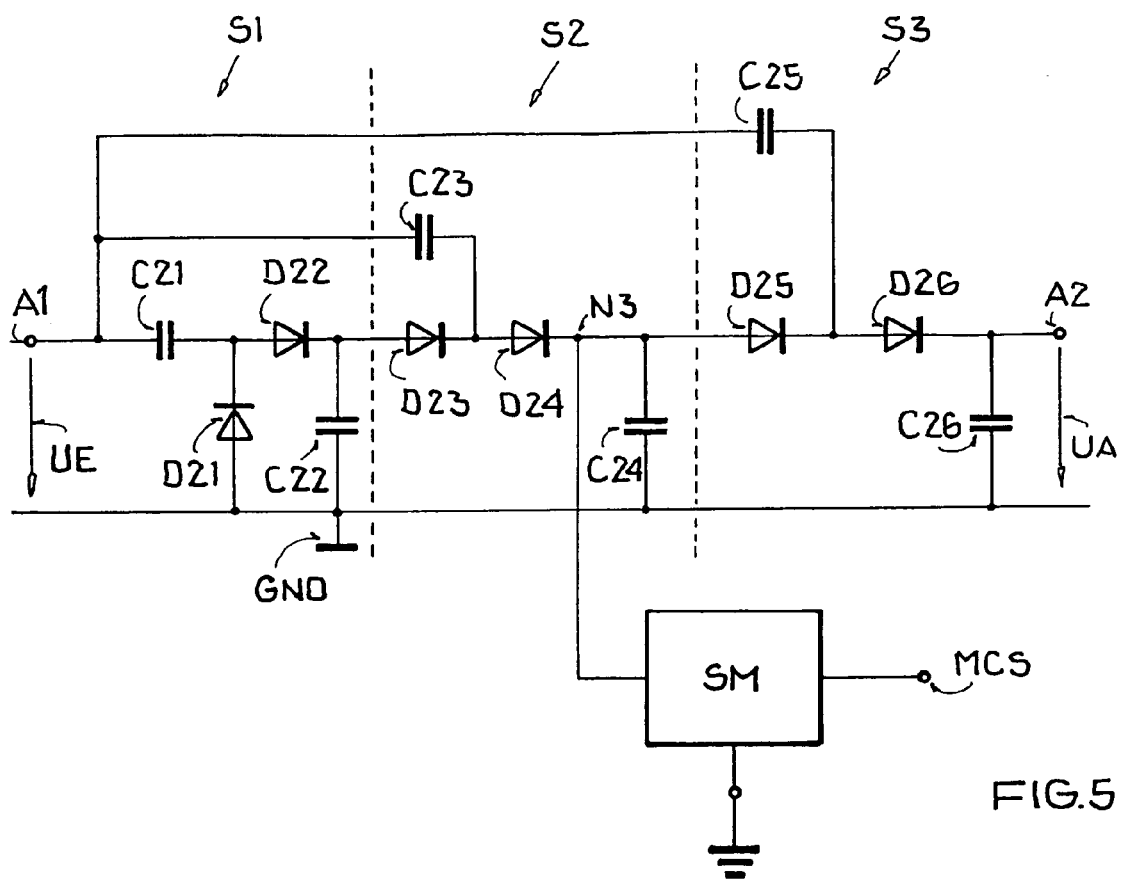
FIG. 5 is an enlarged detail schematic circuit diagram of a multi-stage voltage multiplier circuit according to FIG. 4, providing a modulation intervention at an inter-stage node of the voltage multiplier.

As an enlarged detailed view, FIG. 5 shows a circuit diagram of the voltage multiplier circuit providing a modulation intervention point or connection in the rectifier GL in the arrangement according to FIG. 4. As an example, the voltage multiplier circuit is constructed with three stages S1, S2 and S3, which are arranged and connected in series between an input and an output of the overall voltage multiplier circuit. In actual practice, any desired number of such stages can be coupled together, for example depending on the desired output voltage of the resulting multi-stage voltage multiplier circuit. The input voltage UE is applied between an input pole A1 and a reference potential, generally ground GND. The output voltage UA is tapped at an output pole A2 relative to ground GND. An output of each respective preceding stage is respectively coupled with an input of the next following stage.

The first stage Si comprises two capacitors C21 and C22 and two diodes D21 and D22. One terminal of the capacitor C21 is connected to the input pole A1, while the other terminal of the capacitor C21 is connected with the cathode of the diode D21 and with the anode of the diode D22. The anode of the diode D21 and one terminal of the capacitor C22 are connected with the reference potential or ground GND. The other terminal of the capacitor C22 and the cathode of the diode D22 are connected with each other and together form the output of the first stage S1 relative to the reference potential or ground.

The second stage S2 comprises two capacitors C23 and C24 as well as two diodes D23 and D24. The anode of the diode D23 is connected with an output pole of the first stage S1, i.e. provided by the cathode of the diode D22 and one terminal of the capacitor C22. The diodes D23 and D24 are connected in series in the forward conducting direction between the input pole and an output pole of this second stage S2. The capacitor C24 is connected between the output pole and the reference potential such as ground GND. The first stage S1, or actually the input pole A1, is additionally coupled with the second stage S2 through the capacitor C23, having one of its terminals connected with the input pole A1 and its other terminal connected to the cathode of the diode D23 and the anode of the diode D24.

The third stage S3 comprises two capacitors C25 and C26 as well as two diodes D25 and D26. This stage S3 is constructed and connected in the same manner as the second stage S2.

For carrying out the amplitude shift keying, the output of the second stage S2 at a node or junction point N3 is connected with a switching device SM, for example the transistor T2 in the arrangement of FIG. 4. The switching device SM selectively connects the intermediate output, e.g. the intermediate node or junction point N3, to the reference potential, e.g. ground GND, in synchronism with a control signal, e.g. the modulation control signal MCS of FIG. 4, which is also applied to the switching device SM. This will cause a variation of the voltage at the intermediate node or junction point N3 within the multi-stage voltage multiplier circuit, and as a result will cause an amplitude variation, i.e. an amplitude shift keying of the reflected wave, in the manner discussed above.

The advantage of such an intervention or interconnection into one stage of a multi-stage voltage multiplier circuit of a rectifier, in comparison to providing a selectively connected load at the output of the rectifier, is that the capacitive load CL will not be additionally loaded by the switching process. Instead of the illustrated stages S1, S2 and S3, it would alternatively or additionally be possible to provide stages in the manner of a Delon/Greinacher circuit and/or a Villard circuit, of which an output of one stage would be connected with the switching device SM.

As has been clearly explained above in connection with several example embodiments, the invention provides a method and an associated circuit arrangement, which enable a reliable data transmission between a base station and a passive or semi-passive transponder, especially through the modulated backscattered signal reflected from the transponder back to the base station, over a broad range of transmission distances, beginning from relatively small distances and extending to relatively large distances. The circuit arrangements according to the invention can be easily integrated into any existing transponder circuit designs.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A method of wireless data transmission between a base station and a passive receiving/backscattering unit, comprising the steps:
    a) emitting electromagnetic waves from said base station;
    b) receiving said electromagnetic waves as received waves with said receiving/backscattering unit; and
    c) modulating and reflecting said received waves as modulated reflected waves by passive backscattering from said receiving/backscattering unit to said base station, wherein said modulating is carried out in accordance with data that are to be transmitted by said passive backscattering from said receiving/backscattering unit to said base station, and wherein said modulating comprises:
        c1) phase shift keying when a received field strength of said received waves is in a first field strength range, and
        c2) amplitude shift keying when said received field strength is in a second field strength range higher than said first field strength range,
    so as to provide a backscattering distance range of said passive backscattering from said receiving/backscattering unit to said base station that is larger with said phase shift keying than with said amplitude shift keying, and to provide a backscattering transmission quality of said passive backscattering that is higher with said amplitude shift keying than with said phase shift keying.

2. The method of wireless data transmission according to claim 1, wherein said modulating in said step c) comprises performing only said phase shift keying and not said amplitude shift keying when said received field strength is in said first field strength range, and performing both said phase shift keying and said amplitude shift keying superimposed on each other when said received field strength is in said second field strength range.

3. A passive receiving/backscattering arrangement embodied in a passive transponder and adapted to receive electromagnetic waves emitted by a base station and to modulate and reflect said electromagnetic waves by passive backscattering in accordance with data that are to be transmitted by said passive backscattering from said receiving/backscattering arrangement to said base station, wherein said passive receiving/backscattering arrangement comprises:
    a first modulator arrangement that comprises a phase shift keying modulator, and that is adapted to modulate said electromagnetic waves by a first modulation comprising a phase shift keying; and a second modulator arrangement that is different from said first modulator arrangement, and that comprises an amplitude shift keying modulator, and that is adapted to modulate said electromagnetic waves by a second modulation different from said first modulation and comprising an amplitude shift keying;

wherein said first modulator arrangement is activatable selectively in response to a received field strength of said electromagnetic waves received by said receiving/backscattering arrangement being in a first field strength range, and said second modulator arrangement is activatable selectively in response to said received field strength being in a second field strength range higher than said first field strength range, so as to provide a backscattering distance range of said passive backscattering from said receiving/backscattering arrangement to said base station that is larger with said phase shift keying than with said amplitude shift keying, and to provide a backscattering transmission quality of said passive backscattering that is higher with said amplitude shift keying than with said phase shift keying.

4. The receiving/backscattering arrangement according to claim 3, further comprising a rectifier with an output to which said second modulator arrangement is connected.

5. The receiving/backscattering arrangement according to claim 3, wherein said second modulator arrangement comprises a regulator and reference elements connected to said regulator and adapted to provide an adjustable set point value to said regulator.

6. The receiving/backscattering arrangement according to claim 5, wherein said regulator is a voltage regulator and said reference elements comprise zener diodes.

7. The receiving/backscattering arrangement according to claim 3, wherein said second modulator arrangement comprises:
   a limiter circuit including plural diodes connected serially in a forward conducting direction between a supply voltage and a reference potential; and
   a controllable switching device having a controlled conduction path connected between said reference potential and a junction point between two of said diodes, and having a control input connected to a control line providing a modulation control signal.

8. The receiving/backscattering arrangement according to claim 3, wherein said second modulator arrangement comprises:
   plural diodes connected serially in a forward conducting direction between a supply voltage and a reference potential;
   a controllable switching device having a controlled conduction path connected between said supply voltage arid said reference potential, and having a control input; and
   a logic gate having an output connected to said control input of said controllable switching device, a first input connected to a junction point between two of said diodes, and a second input connected to a control line providing a modulation control signal.

9. The receiving/backscattering arrangement according to claim 8, wherein said logic gate is an AND gate.

10. The receiving/backscattering arrangement according to claim 3, wherein said second modulator arrangement comprises:
    plural diodes connected serially in a forward conducting direction between a supply voltage and a reference potential;
    a voltage multiplier circuit including plural successive stages;
    a controllable switching device having a controlled conduction path connected between a circuit node of one of said stages of said voltage multiplier circuit and said reference potential, and having a control input; and
    a logic gate having an output connected to said control input of said controllable switching device, a first input connected to a junction point between two of said diodes, and a second input connected to a control line providing a modulation control signal.

11. The receiving/backscattering arrangement according to claim 10, wherein said logic gate is an AND gate.

12. A modulator arrangement for amplitude shift keying modulation of received electromagnetic waves according to data that are to be transmitted, comprising:
    a rectifier including a multistage voltage multiplier circuit having plural successive stages; and
    a controllable switching device having a controlled conduction path connected between a circuit node of one of said stages of said voltage multiplier circuit and a reference potential, and having a control input connected to a control line providing a modulation control signal.

13. The modulator arrangement according to claim 12, wherein said circuit node is an output node of said one of said stages.

* * * * *

UNITED STATES PATENT AND TRADEMARK OFFICE
CERTIFICATE OF CORRECTION

| | | |
|---|---|---|
| PATENT NO. | : 7,151,436 B2 | Page 1 of 1 |
| APPLICATION NO. | : 10/753859 | |
| DATED | : December 19, 2006 | |
| INVENTOR(S) | : Fischer et al. | |

It is certified that error appears in the above-identified patent and that said Letters Patent is hereby corrected as shown below:

Column 5,
Line 23, after "it can be", delete --s--;

Column 14,
Line 3, before "said", replace "arid" by --and--.

Signed and Sealed this

Nineteenth Day of June, 2007

JON W. DUDAS
*Director of the United States Patent and Trademark Office*